United States Patent
Chen et al.

(10) Patent No.: US 9,455,353 B2
(45) Date of Patent: Sep. 27, 2016

(54) SUBSTRATE WITH MULTIPLE ENCAPSULATED DEVICES

(75) Inventors: Po-Jui Chen, Sunnyvale, CA (US);
Gary Yama, Mountain View, CA (US);
Matthieu Liger, Seattle, WA (US);
Andrew Graham, Redwood City, CA (US)

(73) Assignee: Robert Bosch GmbH, Stuttgart (DE)

( * ) Notice: Subject to any disclaimer, the term of this patent is extended or adjusted under 35 U.S.C. 154(b) by 576 days.

(21) Appl. No.: 13/563,626

(22) Filed: Jul. 31, 2012

(65) Prior Publication Data

US 2014/0035071 A1  Feb. 6, 2014

(51) Int. Cl.
| | |
|---|---|
| H01L 29/84 | (2006.01) |
| H01L 29/66 | (2006.01) |
| B81C 1/00 | (2006.01) |
| G01C 19/5783 | (2012.01) |
| G01P 15/08 | (2006.01) |
| G01P 15/18 | (2013.01) |

(52) U.S. Cl.
CPC ............ *H01L 29/84* (2013.01); *B81C 1/0023* (2013.01); *G01C 19/5783* (2013.01); *G01P 15/0802* (2013.01); *G01P 15/18* (2013.01); *H01L 29/66007* (2013.01); *B81B 2201/0235* (2013.01); *B81B 2201/0242* (2013.01); *B81B 2207/015* (2013.01); *B81C 2201/0197* (2013.01); *B81C 2203/0136* (2013.01); *B81C 2203/0771* (2013.01)

(58) Field of Classification Search
CPC ............ H01L 29/84; H01L 29/66007; G01C 19/5783; G01P 15/0802; G01P 15/18; B81C 2203/0771; B81C 2201/0197; B81C 2203/0136; B81B 2201/0235; B81B 2201/0242; B81B 2207/015

USPC .................................. 257/415, 790; 438/51
See application file for complete search history.

(56) References Cited

U.S. PATENT DOCUMENTS

| | | | |
|---|---|---|---|
| 7,012,327 B2 | 3/2006 | Huff et al. | |
| 7,075,160 B2 * | 7/2006 | Partridge et al. | ............. 257/414 |
| 7,335,972 B2 | 2/2008 | Chanchani | |
| 7,615,395 B2 | 11/2009 | Heuvelman | |
| 7,748,272 B2 | 7/2010 | Kranz et al. | |
| 7,851,925 B2 | 12/2010 | Theuss et al. | |
| 2006/0079020 A1 * | 4/2006 | Omizo et al. | ................. 438/107 |
| 2009/0309175 A1 * | 12/2009 | Partridge et al. | ............. 257/417 |
| 2010/0176466 A1 * | 7/2010 | Fujii et al. | ..................... 257/415 |
| 2010/0203739 A1 * | 8/2010 | Becker | ................ B81C 1/00531 |
| | | | 438/735 |

(Continued)

OTHER PUBLICATIONS

International Search Report and Written Opinion corresponding to PCT Application No. PCT/US2013/052974, mailed Apr. 17, 2014 (10 pages).

(Continued)

*Primary Examiner* — William F Kraig
*Assistant Examiner* — Pavel Ivanov
(74) *Attorney, Agent, or Firm* — Maginot Moore & Beck LLP

(57) ABSTRACT

A device with multiple encapsulated functional layers, includes a substrate, a first functional layer positioned above a top surface of the substrate, the functional layer including a first device portion, a first encapsulating layer encapsulating the first functional layer, a second functional layer positioned above the first encapsulating layer, the second functional layer including a second device portion, and a second encapsulating layer encapsulating the second functional layer.

20 Claims, 4 Drawing Sheets

(56) References Cited

U.S. PATENT DOCUMENTS

| | | | |
|---|---|---|---|
| 2011/0120221 A1* | 5/2011 | Yoda | B81B 3/0086 73/514.32 |
| 2012/0032283 A1* | 2/2012 | Frey et al. | 257/415 |

OTHER PUBLICATIONS

Graham et al, "A Method for Wafer-Scale Encapsulation of Large Lateral Deflection MEMS Devices," Journal of Microelectromechanical Systems, Feb. 2010, pp. 28-37, vol. 19, No. 1, IEEE, USA (10 pages).

InvenSense website page, "MPU-6000/6050: World's First Integrated 3-Axis Gyro, 3-Axis Accel and 9-Axis Sensor Fusion," http://www.invensene.com/mems/gyro/mpu6000.html, published at least as early as Apr. 6, 2011 (2 pages).

Johnson, "MEMS gyro/accelerometer combo chip debuts," EE/Times News & Analysis, Nov. 8, 2010 (3 pages).

Mannion, "ISSCC: Bosch unveils integrated MEMS automotive sensor," EE/Times, Feb. 8, 2010 (2 pages).

Requicha et al., "Layered Nanoassembly of Three-Dimensional Structures," Laboratory for Molecular Robotics, University of Southern California (4 pages).

Shimooka et al., "Robost Hermetic Wafer Level Thin-Film Encapsulation Technology for Stacked MEMS/IC Package," 2008 Electronic Components and Technology Conference, pp. 824-828, IEEE, Japan (5 pages).

Becker et al., "A New Wafer Level Packaging Approach: Encapsulation, Metallization and Laser Structuring for Advanced System in Package Manufacturing," Journal of Electronic Packaging, Mar. 2005, vol. 127, pp. 1-6, USA.

Slocum et al., "Precision passive mechanical alignment of wafers," Journal of Microelectromechanical Systems, vol. 12, Issue: 6, pp. 826-834, Dec. 2003, USA.

\* cited by examiner

FIG. 6
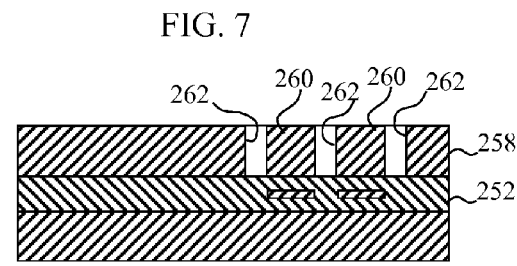
FIG. 7
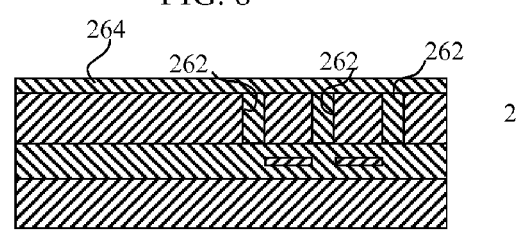
FIG. 8
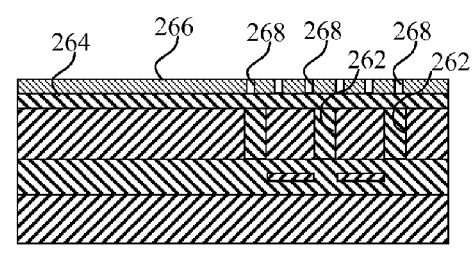
FIG. 9
FIG. 10
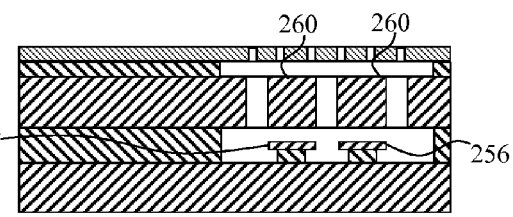
FIG. 11
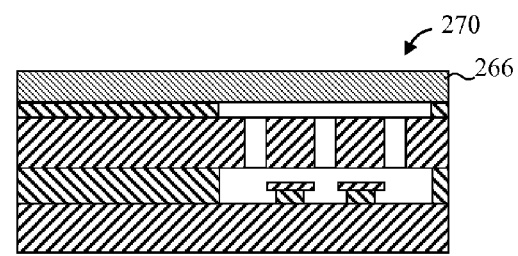
FIG. 12
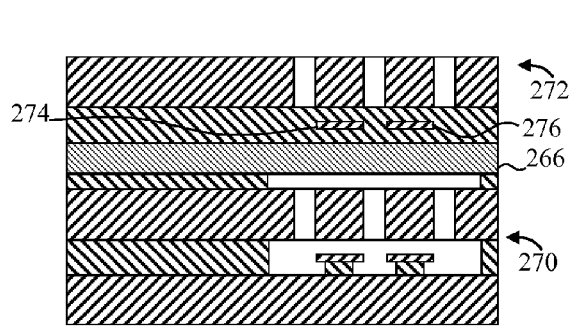
FIG. 13
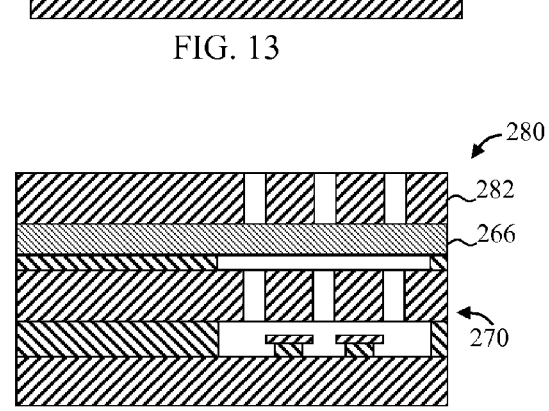
FIG. 14

SUBSTRATE WITH MULTIPLE ENCAPSULATED DEVICES

FIELD OF THE INVENTION

This invention relates to fabrication processes for semiconductor devices.

BACKGROUND

Microelectromechanical systems (MEMS), for example, gyroscopes, resonators and accelerometers, utilize micromachining techniques (i.e., lithographic and other precision fabrication techniques) to reduce mechanical components to a scale that is generally comparable to microelectronics. MEMS typically include a mechanical structure fabricated from or on, for example, a silicon substrate using micromachining techniques.

One issue which arises in various MEMS devices is data processing/sensor interaction. One example of this interaction is in devices incorporating a magnetometer and an accelerometer. In order to output correct heading angle data, the tilt of the accelerometer must be compensated. If tilt compensation is not available, the output data is not reliable since unquantified/inconsistent misalignment between the accelerometer and the magnetometer may be present. Similar situations arise in the context of other sensor interactions such as accelerometer-gyroscope interactions and gyroscope-magnetometer interactions.

Accordingly, while different sensors/devices in different chips on a circuit board can be combined to provide up to 10 degrees of sensing freedom (3-axis acceleration, 3-axis angular rate, 3-axis magnetic field, environment pressure), very few of these devices are commercially available since set-up of devices with interaction between heterogeneous sensors is exhausting. The resultant alignment error/discrepancy among sensors hinders end applications. Additionally, circuit board warpage due to stress/temperature can ruin the readouts.

Another approach to providing increased functionality is to use package level integration (system in package or SIP). SIP is derived from the concept of ASIC+MEMS (accelerometer, gyroscope, magnetometer, pressure sensor, . . . ). The advantage of SIP is that multiple MEMS sensors/devices can be integrated. The SIP approach is tenable for limited numbers of sensors, e.g., ASIC+MEMS (accelerometer, gyroscope, magnetometer, . . . ). Incorporation of additional functionality, however, is problematic. For example, because the approach relies upon planar integration, the footprint of the SIP increases rapidly. A large footprint is a particular concern in applications for consumer electronics, such as cellular phones. Vertical integration of the individually packaged sensors is likewise an issue in consumer electronics. Moreover, as the footprint/height of the SIP increases, the potential for alignment errors between sensors also increases.

What is needed is a method of forming wafers such that provides multiple microsensors/microdevices. A wafer that exhibits a small form factor while incorporating multiple microsensors/microdevices is also needed. A wafer incorporating multiple microsensors/microdevices which can be manufactured using proven processes would be further beneficial.

SUMMARY

In accordance with one embodiment of the present invention, there is provided a device with multiple thin-film encapsulated functional layers including a substrate, a first functional layer positioned above a top surface of the substrate, the functional layer including a first device portion, a first thin-film encapsulating layer encapsulating the first functional layer, a second functional layer positioned above the first thin-film encapsulating layer, the second functional layer including a second device portion, and a second thin-film encapsulating layer encapsulating the second functional layer.

In accordance with a further embodiment, a method of forming a device with multiple thin-film encapsulated devices includes providing a substrate, forming a first functional layer above a top surface of the substrate, the functional layer including a first device portion, encapsulating the first functional layer with a first thin-film encapsulating layer, forming a second functional layer above the first thin-film encapsulating layer, the second functional layer including a second device portion, and encapsulating the second functional layer with a second thin-film encapsulating layer.

BRIEF DESCRIPTION OF THE DRAWINGS

FIG. 6 depicts a cross-sectional view of a substrate, which in this embodiment is a silicon substrate, but which in another embodiment is a silicon on insulator (SOI) substrate, which may be used in a device in accordance with principles of the present invention;

FIG. 7 depicts a cross-sectional view of the substrate of FIG. 6 with a portion of a buried oxide layer supporting two electrodes;

FIG. 8 depicts a cross-sectional view of the device of FIG. 7 with the buried oxide layer (also referred to as a sacrificial layer) fully formed and supporting a functional layer which has been etched to form two movable portions of a functional component;

FIG. 9 depicts a cross-sectional view of the device of FIG. 8 with a sacrificial oxide layer filling the trenches and also formed upon the upper surface of the functional layer;

FIG. 10 depicts a cross-sectional view of the device of FIG. 9, with a portion of a thin-film encapsulation layer formed on the upper surface of the sacrificial layer and vent holes etched through the portion of a thin-film encapsulation layer;

FIG. 11 depicts a cross-sectional view of the device of FIG. 10 after vapor etching has been used to defined electrodes and to release resonators for the functional component;

FIG. 12 depicts a cross-sectional view of the device of FIG. 11 after the remaining portion of the thin-film encapsulation layer has been formed and, in some embodiments, after the thin-film encapsulation layer has been planarized;

FIG. 13 depicts a cross-sectional view of the device of FIG. 12 with a portion of a second functional component, including electrodes beneath the functional layer, formed above the functional component of FIG. 12; and FIG. 14 depicts a cross-sectional view of the device of FIG. 12 with a portion of a second functional component formed above the functional component of FIG. 12.

DESCRIPTION

Figure 1:
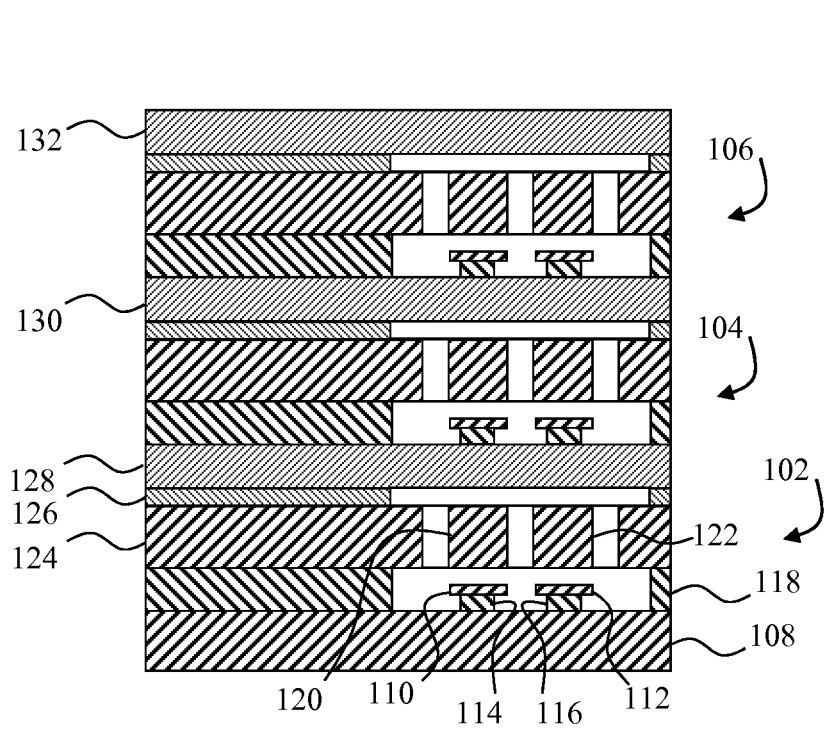
FIG. 1 depicts a side cross-sectional view of a wafer device with three stacked functional components, with two of the stacked functional components formed above a thin-film encapsulation layer of a previously formed functional component in accordance with principles of the present invention.

For the purposes of promoting an understanding of the principles of the invention, reference will now be made to the embodiments illustrated in the drawings and described in the following written specification. It is understood that no limitation to the scope of the invention is thereby intended. It is further understood that the present invention includes any alterations and modifications to the illustrated embodiments and includes further applications of the principles of the invention as would normally occur to one skilled in the art to which this invention pertains.

FIG. 1 depicts a partial side cross-sectional view of a wafer device 100. The wafer device 100 includes a first functional component 102, a second functional component 104, and a third functional component 106. The functional components 102, 104, and 106 are stacked in that each functional component is located above or below another of the functional components. In some embodiments, only two stacked functional components are provided. In other embodiments, more than three stacked functional components are provided. Moreover, while the functional components 102, 104, and 106 are generally aligned in the embodiment of FIG. 1, in some embodiments one or more of the stacked functional components are offset. The functional components 102, 104, and 106 may be of the same type (e.g., gyroscope) or of different types (e.g., one accelerometer and one gyroscope). Additional functional components of the same or different types may also be included on the wafer device 100.

The functional component 102 is positioned on a top surface of a substrate 108, which, in this embodiment, is a silicon substrate. In some embodiments, the functional component 102 is formed from a silicon-on-insulator (SOI) substrate and includes an SOI handle layer, a buried oxide layer and an SOI functional layer. The functional component 102 includes two electrodes 110 and 112 which are supported by two portions 114 and 116, respectively, of a buried oxide layer 118.

Directly above the two electrodes 110 and 112, two resonators 120 and 122 are formed in a functional layer 124. A sacrificial layer portion 126 is located on the upper surface of the functional layer 124, and a thin-film encapsulation layer 128 encloses the functional component 102.

The functional component 104 differs from the functional component 102 in that the functional component 104 is formed on the top surface of the thin-film encapsulation layer 128. Likewise, the functional component 106 is formed on the top surface of a thin-film encapsulation layer 130 of the functional component 104. The functional component 106 is encapsulated by a thin-film encapsulation layer 132.

The wafer device 100 provides a number of benefits over previously known devices. The wafer device 100 has a small form factor compared to previous devices. Additionally, the number of chips required to perform desired functions is reduced compared to approaches which integrate chips on a board level.

Figure 2:
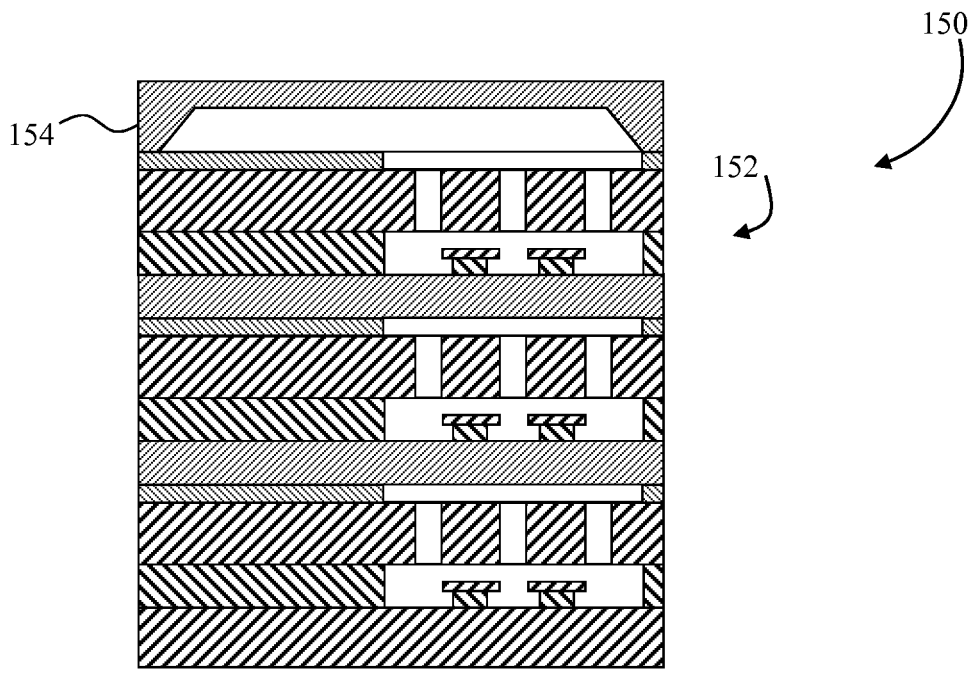
FIG. 2 depicts a side cross-sectional view of a wafer device with three stacked functional components, with two of the stacked functional components formed above a thin-film encapsulation layer of a previously formed functional component with the uppermost functional component sealed by a cap in accordance with principles of the present invention.

While one embodiment of a wafer device has been described with reference to FIG. 1, a number of modifications are possible. By way of example, FIG. 2 depicts a wafer device 150 which is similar to the wafer device 150. The main difference is that the uppermost functional component 152 in the wafer device 150 is not encapsulated by a thin-film. Rather, a cap 154 is used to seal the uppermost functional component 152.

Figure 3:
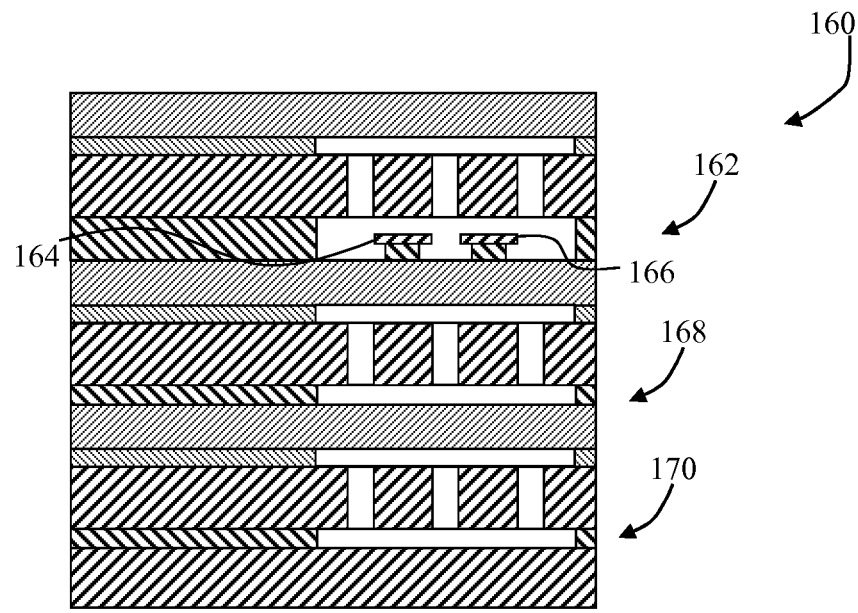
FIG. 3 depicts a side cross-sectional view of a wafer device with three stacked functional components, with one of the stacked functional components having electrodes beneath the functional layer and the uppermost functional component including a thin-film encapsulation layer in accordance with principles of the present invention.

As noted above, the various functional components in the devices including devices 100 and 150 need not be identical. Moreover, functional units other than those depicted above may be formed. By way of example, FIG. 3 depicts a wafer device 160 with an uppermost functional component 162. The functional component 162 is substantially identical to the functional component 102, including two electrodes 164 and 166. Neither of the other functional components 168 and 170, however, includes electrodes beneath the respective functional layer.

Figure 4:
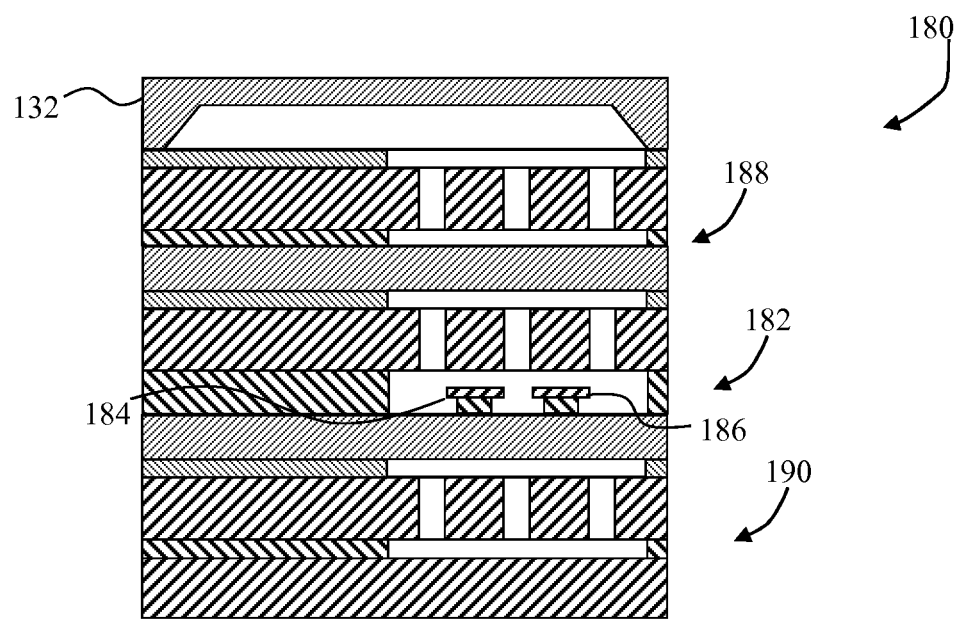
FIG. 4 depicts a side cross-sectional view of a wafer device with three stacked functional components, with one of the stacked functional components having electrodes beneath the functional layer and the uppermost functional component sealed with a cap in accordance with principles of the present invention.

The wafer device 180 of FIG. 4 depicts a capped device with a middle functional component 182 that is substantially identical to the functional component 102, including two electrodes 184 and 186. Neither of the other functional components 188 and 190, however, includes electrodes beneath the respective functional layer.

Accordingly, a wide variety of combinations of functional components and a variety of sealing methods may be used for a given application. The ability to form such a wide variety of devices in a small form factor is realized by incorporation of one or more functional components which are sealed using thin-film encapsulation technology. U.S. Pat. No. 7,288,824, which issued on Oct. 30, 2007, the entire contents of which are herein incorporated by reference, discloses a thin-film encapsulation process. U.S. Pat. No. 7,859,067, which issued on Dec. 28, 2010, the entire contents of which are herein incorporated by reference, also discloses a thin-film encapsulation process. By using a thin-film encapsulation layer to seal a functional component, the thin-film encapsulation layer may be used as a substrate upon which another functional component is formed.

Figure 5:
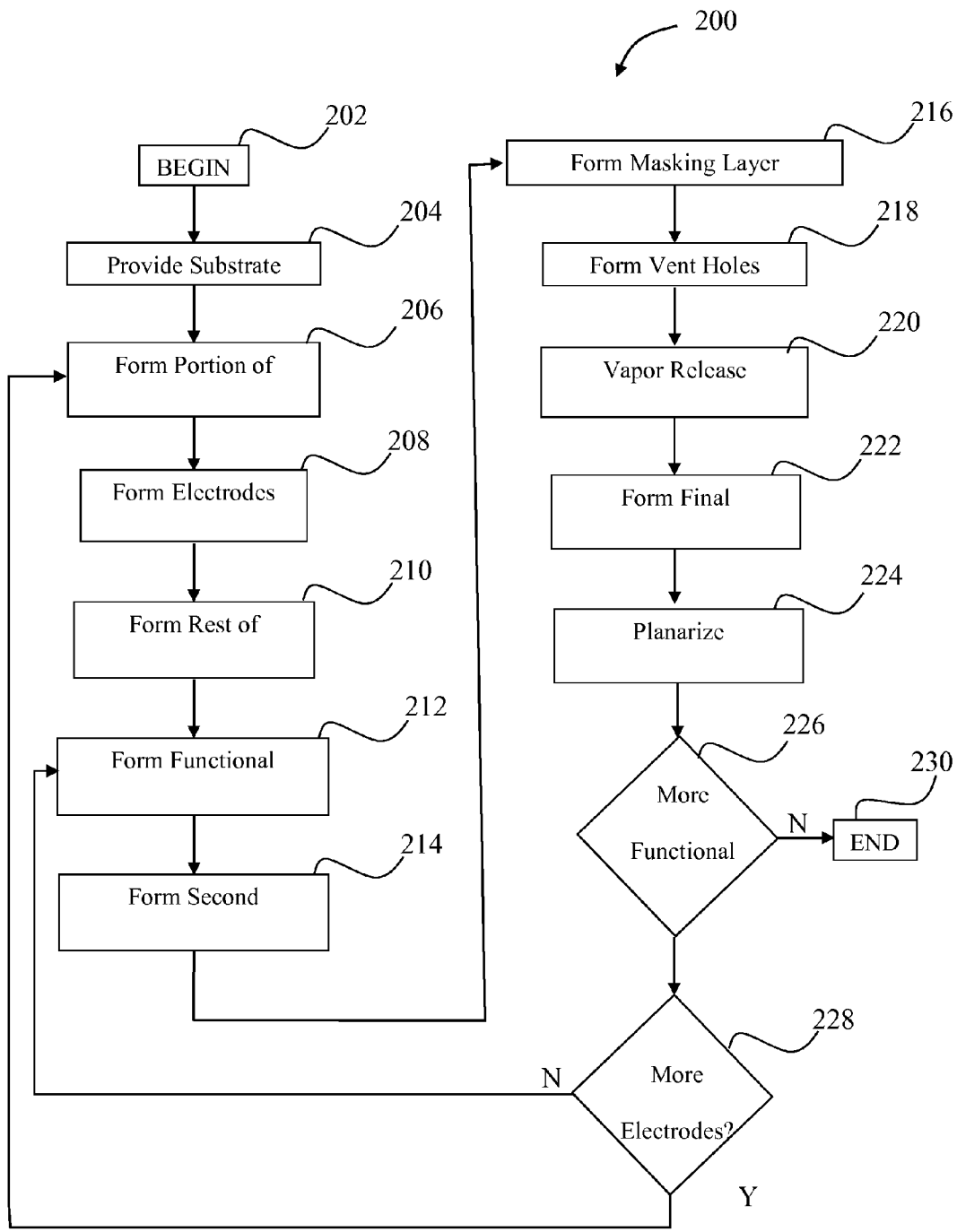
FIG. 5 depicts a flow chart of a process for manufacturing a device with stacked functional components, with a subsequently formed functional component formed above a thin-film encapsulation layer of a previously formed functional component.

One example of a process for forming a device incorporating a thin-film encapsulation layer as a substrate for a subsequent functional component is described with reference to FIG. 5. FIG. 5 shows a flow chart 200 of a manufacturing process. The process 200 of FIG. 5 begins (block 202) and a substrate is provided (block 204). A first portion of a sacrificial layer is then formed (block 206) as a support for one or more electrodes which are formed on the sacrificial layer (block 208). The electrodes and the first portion of a sacrificial layer are then covered by second portion of the sacrificial layer (block 210). At block 212, a device layer is formed and etched to form a desired functional component.

The functional component is then sealed with a sacrificial oxide layer (block 214). In some embodiments, electrical contacts are then etched into the seal layer. At block 216, a first portion of a thin-film encapsulation layer, which in this embodiment is a thin silicon layer, is formed over the seal layer. Vent holes are etched through the thin silicon layer (block 218) and a vapor phase hydrofluoric acid (HF) is used to etch the sacrificial oxide layer to release the functional component (block 220). A second portion of the thin-film encapsulation layer is formed (block 222) which closes the vents and provides structural stability, and the top surface of the thin-film encapsulation layer is planarized using chemical mechanical polishing (CMP) (block 224).

In some embodiments, portions of the planarized surface are etched to provide trenches which define isolated pillars of silicon for electrical throughputs and an oxide layer is deposited on the wafer to close the trenches and then etched to define electrical contacts. In some embodiments, the wafer is exposed to a controlled environment (to selectively modify the pressure within the area surrounding the functional components as described in U.S. Patent Publication No. 2009/0309175 and U.S. Publication No. 2010/0240163, the entire contents each of which are herein incorporated by reference.

If additional functional components are desired at block 226, the process 200 then continues at block 228. If the additional functional component will have electrodes located beneath the functional component, the process proceeds to block 206. If the additional functional component will not have electrodes located beneath the functional component, the process proceeds to block 212. In the event that no further functional components are desired, the process 200 ends at block 230.

One partial example of the process of FIG. 5 is shown in FIGS. 6-14. A substrate 250 is shown in FIG. 6. The provided substrate 250 in this embodiment is a silicon substrate. A portion of a sacrificial layer 252 is formed on the substrate 250 (see FIG. 7) and electrodes 254/256 are formed using any desired process. The remaining portion of the sacrificial layer 252 is then formed, encasing the electrodes 254/256 (FIG. 8). A functional layer 258 is formed on the sacrificial layer 252 and one or more movable portions 260 are etched. In one embodiment, deep reactive ion etching (DRIE) of the functional layer 258 creates trenches 262 which define unreleased resonators. Next, a sacrificial layer 264 of LPCVD oxide is used to seal the trenches 262.

A first portion 266 of a silicon thin-film encapsulation layer is deposited on the sacrificial layer 264. In one embodiment, the first portion 266 is about 2 microns in depth. Vent holes 268 are etched through the first portion 266 as shown in FIG. 10. Vapor-phase HF is used to etch the sacrificial layer 264 located adjacent to the vent holes 268. Etching of the sacrificial layer 264 adjacent to the vent holes 268 exposes some of the trenches 262 allowing the etch vapor to release resonator structures 260 and expose electrodes 254/256 as shown in FIG. 11. A second portion of the silicon thin-film encapsulation layer 266 is deposited on top of the first portion and the silicon thin-film encapsulation layer 266 is planarized (see FIG. 12) resulting in a first functional component 270.

A second functional component is then formed above the first functional component 270. For embodiments wherein the second functional component includes electrodes below the functional layer, the same process described above with respect to FIGS. 7-11 are followed resulting in the configuration of FIG. 13. In FIG. 13, a partial second functional component 272 is shown which includes two electrodes 274/276.

In embodiments wherein the second functional component does not include electrodes below the functional layer, a functional layer is deposited directly on the planarized thin-film encapsulation layer 266 as depicted in FIG. 14. In FIG. 14, a partial second functional component 280 is shown with a functional layer 282 formed directly on the planarized thin-film encapsulation layer 266.

The addition of subsequent functional components above previously formed functional components continues until all of the desired functional components have been substantially completed. In some embodiments the uppermost functional component is sealed by thin-film encapsulation (see, e.g., wafer device 100 of FIG. 1), while in other embodiments, thin-film encapsulation is only used for functional components other than the uppermost functional component, with a cap used to seal the uppermost functional component (see, e.g., FIG. 2). A cap is attached to the uppermost functional component using any desired method such as fusion bonding, anodic bonding, metal/metal alloy bonding, thermocompression, soldering, laser assisted bonding, glass frit bonding, and eutectic bonding.

Once the device is sealed, the wafer may be thinned by grinding the substrate. Additionally, wafer sawing or the like may be used for die singulation. Stacked functional component wafers may be arranged side-by-side on a die or vertically stacked. Wire bonding and chip packaging may be performed following a desired process. In some embodiments, a wafer with stacked functional components may be electronically integrated at a wafer level (prior to die singulation) using low-temperature, CMOS compatible wafer bonding. In some embodiments, an electronics wafer is incorporated on top of a MEMS wafer with stacked functional components.

While the above described embodiments were based upon a silicon wafer substrate, the above described devices and processes are also compatible with SOI substrates with some modification. By way of example, the process 200 of FIG. 5 is modified to provide an SOI substrate at block 204, and the process skips to block 212 wherein the functional component is formed in the functional layer of the SOI substrate.

The foregoing describes a manufacturing process flow that produces multiple microdevices on a single substrate thereby enabling more semiconductor chip functionalities (e.g., motion/inertial sensing applications) while minimizing (1) the number of chips compared to integration on board level, and (2) the form factor compared to integration on package level (i.e., system-in-package, SIP). This result in high multiple microsensors/microdevices integration toward better data output performance, small form factor in overall chip package, and high manufacture compatibility with existing/validated process steps.

Some of the devices which may be formed using the above described processes include MEMS inertial/motion sensors including inertial measurement units (IMU) with nine degrees of freedom. The degrees of freedom in the IMU include 3-axis acceleration, 3-axis angular rate, and 3-axis magnetic field. In some embodiments, a pressure sensor can be included to obtain object height information. The resulting device is a full automobile/pedestrian navigation sensor which is a complementary system to GPS.

While the invention has been illustrated and described in detail in the drawings and foregoing description, the same should be considered as illustrative and not restrictive in character. It is understood that only the preferred embodiments have been presented and that all changes, modifications and further applications that come within the spirit of the invention are desired to be protected.

The invention claimed is:

1. A device with multiple encapsulated functional layers, comprising:
    a substrate;
    a first functional layer positioned above a top surface of the substrate, the functional layer including a first device portion;
    a first encapsulating layer encapsulating the first functional layer;
    a second functional layer positioned above the first encapsulating layer, wherein there is no intervening structure between at least a portion of the second functional layer and the first encapsulating layer, the second functional layer including a second device portion; and
    a second encapsulating layer encapsulating the second functional layer.

2. The device of claim 1, wherein the second functional layer is directly on a top surface of the first encapsulating layer.

3. The device of claim 1, further comprising:
    at least a portion of a sacrificial layer directly on the first encapsulating layer, wherein the second functional layer is positioned directly on the at least a portion of a sacrificial layer.

4. The device of claim 1, wherein the substrate comprises: a silicon on insulator substrate.

5. The device of claim 1, further comprising:
    a partially etched first sacrificial layer positioned on a top surface of the first functional layer.

6. The device of claim 5, further comprising:
    a partially etched second sacrificial layer positioned on a top surface of the second functional layer.

7. The device of claim 6, further comprising:
    a third functional layer positioned above the second encapsulating layer, wherein there is no intervening structure between at least a portion of the third functional layer and the second encapsulating layer, the third functional layer including a third device portion; and
    a third encapsulating layer encapsulating the third functional layer.

8. The device of claim 6, further comprising:
    a third functional layer positioned above the second encapsulating layer, wherein there is no intervening structure between at least a portion of the third functional layer and the second encapsulating layer, the third functional layer including a third device portion; and
    a cap sealing the third functional layer.

9. The device of claim 1, wherein:
    an upper surface of the first encapsulating layer is planarized; and
    the second functional layer is positioned directly on the planarized upper surface.

10. The device of claim 1, wherein the first device portion comprises an accelerometer portion and the second device portion comprises a gyroscope portion.

11. A method of forming a device with multiple encapsulated devices, comprising:
    providing a substrate;
    forming a first functional layer above a top surface of the substrate, the functional layer including a first device portion;
    encapsulating the first functional layer with a first encapsulating layer;
    forming a second functional layer so as to be above the first encapsulating layer, wherein there is no intervening structure between at least a portion of the second functional layer and the first encapsulating layer when the device is finally formed, the second functional layer including a second device portion; and
    encapsulating the second functional layer with a second encapsulating layer.

12. The method of claim 11, wherein forming a second functional layer comprises:
    forming the second functional layer on the top surface of the first encapsulating layer.

13. The method of claim 11, wherein:
    the method includes forming a sacrificial layer directly on the first encapsulation layer; and
    forming a second functional layer includes forming the second functional layer directly on a top surface of the sacrificial layer.

14. The method of claim 11, wherein providing a substrate comprises:
    providing a silicon on insulator substrate.

15. The method of claim 11, further comprising:
    forming a first sacrificial layer on a top surface of the first functional layer; and
    etching at least a portion of the first sacrificial layer.

16. The method of claim 15, further comprising:
    forming a second sacrificial layer on a top surface of the second functional layer; and
    etching at least a portion of the second sacrificial layer.

17. The method of claim 16, further comprising:
    forming a third functional layer so as to be above the second encapsulating layer, wherein there is no intervening structure between at least a portion of the third functional layer and the second encapsulating layer when the device is finally formed, the third functional layer including a third device portion; and
    encapsulating the third functional layer with a third encapsulating layer.

18. The method of claim 16, further comprising:
    forming a third functional layer so as to be above the second encapsulating layer, wherein there is no intervening structure between at least a portion of the third functional layer and the second encapsulating layer when the device is finally formed, the third functional layer including a third device portion; and
    sealing the third functional layer with a cap.

19. The method of claim 11, further comprising:
    planarizing the first encapsulating layer, wherein forming the second functional layer comprises:
    forming the second functional layer directly on the planarized first encapsulating layer.

20. The method of claim 11, wherein the first device portion comprises an accelerometer portion and the second device portion comprises a gyroscope portion.

* * * * *